United States Patent
Frenzel et al.

(10) Patent No.: US 10,677,847 B2
(45) Date of Patent: Jun. 9, 2020

(54) CURRENT SENSOR APPARATUS COMPRISING AN INTEGRATED CLAMPING DEVICE AND A GROUNDING ELEMENT

(71) Applicant: Continental Automotive GmbH, Hannover (DE)

(72) Inventors: Henryk Frenzel, Regensburg (DE); Vinzenz Sauerer, Wenzenbach (DE); Michael Weinacht, Barbing (DE); Christine Spörl, Muxhütte-Haidhof (DE); Manfred Frimberger, Ergoldsbach (DE); Wolfgang Weigert, Tegernheim (DE)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 31 days.

(21) Appl. No.: 14/768,481

(22) PCT Filed: Jan. 30, 2014

(86) PCT No.: PCT/EP2014/051755
§ 371 (c)(1),
(2) Date: Aug. 18, 2015

(87) PCT Pub. No.: WO2014/135312
PCT Pub. Date: Sep. 12, 2014

(65) Prior Publication Data
US 2015/0377980 A1 Dec. 31, 2015

(30) Foreign Application Priority Data

Mar. 5, 2013 (DE) .......... 10 2013 203 760
May 29, 2013 (DE) .......... 10 2013 210 130

(51) Int. Cl.
*G01R 31/364* (2019.01)
*G01R 31/374* (2019.01)
(Continued)

(52) U.S. Cl.
CPC .......... *G01R 31/364* (2019.01); *G01R 1/203* (2013.01); *G01R 31/374* (2019.01); *G01R 31/3828* (2019.01)

(58) Field of Classification Search
CPC .................................. G01R 31/3696
See application file for complete search history.

(56) References Cited

U.S. PATENT DOCUMENTS 7,671,755 B2 * 3/2010 Dreiskemper ......... G01R 1/203
340/425.5
8,305,034 B2 * 11/2012 Rubio .................... G01R 1/203
320/104
(Continued)

FOREIGN PATENT DOCUMENTS

CN 101052885 A 10/2007
CN 101634688 A 1/2010
(Continued)

OTHER PUBLICATIONS

DE 102004055849 translation Jun. 2006, Heim.*
(Continued)

*Primary Examiner* — Robert Grant
*Assistant Examiner* — Tynese V McDaniel
(74) *Attorney, Agent, or Firm* — RatnerPrestia

(57) ABSTRACT

A current sensor device for measuring a current, in particular for measuring a battery current in motor vehicles. The device includes a clamping device for fixing the current sensor device to a maintaining body, an electric resistance element on which the current can be measured by means of a voltage, and an electric mass element by means of which the current sensor device can be electrically coupled to a zero potential. The clamping device, the resistance element and the mass element are integrally formed.

14 Claims, 4 Drawing Sheets

(51) Int. Cl.
*G01R 31/3828* (2019.01)
*G01R 1/20* (2006.01)

(56) References Cited

U.S. PATENT DOCUMENTS

| | | | |
|---|---|---|---|
| 8,466,698 B2 | 6/2013 | Ozawa | |
| 8,970,143 B2 | 3/2015 | Yugou et al. | |
| 2007/0144718 A1* | 6/2007 | Heine | F28D 1/05366 165/173 |
| 2008/0030208 A1* | 2/2008 | Aratani | G01R 1/203 324/713 |
| 2008/0050985 A1 | 2/2008 | Roset et al. | |
| 2009/0010797 A1* | 1/2009 | Aruga | C22C 9/00 420/472 |
| 2011/0241649 A1 | 10/2011 | Ozawa | |
| 2014/0015515 A1 | 1/2014 | Satou | |
| 2014/0209375 A1* | 7/2014 | Linow | H01K 1/06 174/520 |

FOREIGN PATENT DOCUMENTS

| | | | |
|---|---|---|---|
| DE | 102004007851 | 9/2005 | |
| DE | 102004007851 A1 * | 9/2005 | ......... G01R 31/3696 |
| DE | 102004049153 | 4/2006 | |
| DE | 102004053647 | 5/2006 | |
| DE | 102004055848 | 5/2006 | |
| DE | 102004055849 * | 6/2006 | ......... G01R 31/3696 |
| DE | 102006058135 * | 6/2008 | ............. G01R 1/203 |
| DE | 102007009569 | 8/2008 | |
| DE | 102007013806 | 10/2008 | |
| JP | 2011179837 A | 9/2011 | |
| JP | WO 2012137980 * | 10/2012 | ............. G01R 1/203 |
| JP | 2012220249 A | 11/2012 | |
| WO | 2012043591 A1 | 4/2012 | |
| WO | 2012137980 A1 | 10/2012 | |
| WO | WO-2013020621 A2 * | 2/2013 | ............... H01K 1/06 |

OTHER PUBLICATIONS

DE 102006058135 translation Jun. 2008, Lutz.*
DE102004007851 Translation Wagner, Intelligent connector for battery, especially in vehicle,has measurement resistance . . . , Sep. 2005 (Year: 2005).*
German Search Report for German Application No. 10 2013 210 130.9 dated Nov. 7, 2013, including partial translation.
International Search Report for International Application No. PCT/EP2014/051755 dated Jun. 30, 2014.
Korean Office Action for Korean Application No. 10-2015-7027196, dated Jul. 15, 2019, with translation, 10 pages.
Korean Notice of Allowance for Korean Application No. 10-2015-7027196, dated Jan. 30, 2020, with translation, 3 pages.

* cited by examiner

CURRENT SENSOR APPARATUS COMPRISING AN INTEGRATED CLAMPING DEVICE AND A GROUNDING ELEMENT

CROSS REFERENCE TO RELATED APPLICATIONS

This application is the U.S. National Phase Application of PCT/EP2014/051755, filed Jan. 30, 2014, which claims benefit to German Patent Application Nos. 10 2013 203 760.0, filed Mar. 5, 2013 and 10 2013 210 130.9, filed May 29, 2013, the contents of such applications being incorporated by reference herein.

FIELD OF THE INVENTION

The invention relates to a current sensor apparatus for measuring a current, in particular for measuring a battery current in motor vehicles and to a motor vehicle comprising a current sensor apparatus according to the invention.

BACKGROUND OF THE INVENTION

Electric motors are used for a wide variety of functions in motor vehicles, whether it be as the main drive unit in an electric automobile or as drive unit of an electrical power-assisted steering system, for example. The use of electric motors also in many cases requires the use of current sensors for precise measurement of the supply current supplied to the electric motors or of the charging currents supplied to the batteries.

Commercially available current sensors which contain the sensor as a unit in a housing and are provided with interfaces are known. The interfaces are used, inter alia, for attaching the electrical connections, such as data cables or ground, for example. Furthermore, there is also an interface to which a mechanical holder is attached in order to fit the housing fixedly within the motor vehicle.

Although such a configuration has the advantage that the individual parts such as, for example, holder, sensor and grounding element can be obtained from different sources, the disadvantage consists in the high degree of complexity involved with fitting the individual parts.

SUMMARY OF THE INVENTION

An aspect of the invention is therefore a current sensor apparatus which can be produced with a low level of complexity in terms of manufacture and at low cost.

One aspect of the invention is a current sensor apparatus of the type mentioned at the outset, wherein the clamping device, the resistor element and the grounding element are formed in one piece.

An aspect of the invention is based on the basic concept of forming the elements of a current sensor apparatus which are essential to the operation thereof in one piece, as a result of which fitting of the individual elements to one another is superfluous. In contrast to the prior art, fitting of the shunt to a clamping device and a grounding element becomes superfluous. The clamping device, the resistor element and the grounding element are integrated in a component part formed in one piece and are fixedly connected to one another. The one-piece formation enables simple automated production of the current sensor apparatus with a low level of production complexity. Furthermore, a particularly inexpensive current sensor apparatus can be produced in this way.

The clamping device and the grounding element are manufactured from an electrically conductive material and are mechanically and electrically connected directly to the resistor element so as to form a one-piece part with one another. The resistor element can in this case be connected cohesively, for example by means of welding or soldering, to the clamping device and the grounding element to form a one-piece part. The material of the resistor element can differ from the material of the clamping device and the grounding element. However, a monolithic formation of the three elements from a single piece or part is also conceivable.

Within the meaning of aspects of the invention, the clamping device and the grounding element can firstly be considered as connections, via which the current sensor apparatus can be connected into a current path. Therefore, the grounding element should be understood in the sense of a vehicle connection. Generally, the grounding element is in this case electrically connected to a zero potential. However, this does not rule out the possibility of the grounding element being connected to another electrical potential, for example to the connection of a generator or another consumer. The current sensor apparatus could thus be connected, for example, between a positive pole of a battery and a generator, wherein the clamping device would be connected electrically to the positive pole and the grounding element would be connected electrically to the generator. It is likewise possible for the current sensor apparatus to be connected between a negative connection of a battery and a ground. In such a case, the grounding element would be connected electrically to ground.

Advantageously, the current sensor apparatus is developed by virtue of the fact that the clamping device, the resistor element and the grounding element are formed form a one-piece, in particular a single, sheet-metal element. The clamping device, the resistor element and the grounding element are formed integrated in the one-piece sheet-metal element. The sheet-metal element has a basic shape which can be completed by further processing, for example by bending, to form the final form of the current sensor apparatus. In this way, the current sensor apparatus can be produced in a particularly efficient manner and at particularly low cost. The fact that a resistor element consisting of a separate material is dispensed with results in an essential simplification of the production process and reduction in production costs. In order to measure the current, the voltage or the voltage drop across two points on the sheet-metal element is measured. Deviations in the electrical resistance of the sheet-metal element as a result of changes in temperature can in this case be taken into consideration and compensated for in the evaluation method, with the result that a sufficiently accurate current measurement is possible for many application cases.

An embodiment of the current sensor apparatus according to the invention in which the resistor element is in the form of a measuring section integrated in the sheet-metal element is particularly advantageous. The measuring region which is delimited on a section of the sheet-metal element can be optimized in this way in respect of the electrical resistance in order to achieve a more precise current measurement.

One possibility for optimization as regards the current measurement consists, in accordance with an advantageous embodiment of the current sensor apparatus according to the invention, in providing the measuring section with recesses. By adding defined recesses, the electrical resistance within the measuring section can be varied in a desired manner. In particular, the electrical resistance of the measuring section can be increased in this way.

An optimization variant in accordance with one embodiment of the current sensor apparatus according to the invention in which the measuring section has hollow-shaped recesses at the edge regions has proven to be particularly advantageous.

Likewise, an embodiment of the current sensor apparatus according to the invention which has a measuring unit, wherein the measuring unit has a temperature sensor, is advantageous. The measuring unit is preferably coupled thermally to the sheet-metal element. In this way, the temperature of the sheet-metal element can be determined by means of the temperature sensor. It is possible on the basis of the present temperature and the material properties to calculate the influence of the temperature on the electrical resistance of the resistor element. Thus, the temperature influence on the measured voltage drop can be taken into consideration in an evaluation method in order to determine the actual current flow more precisely.

In this case, an embodiment of the current sensor apparatus according to the invention in which the clamping device is in the form of a battery terminal is particularly advantageous. The direct connection of the current sensor apparatus to a battery connection enables direct thermal coupling of the current sensor apparatus to the battery in order to measure the temperature at the battery connection. In this way, the temperature of the battery can be determined particularly precisely in order to estimate the state of the battery. When using the battery in a motor vehicle, therefore, it is therefore possible to avoid the internal combustion engine being switched off when the battery is not yet at an optimum operating temperature. In addition, the current sensor apparatus can be connected electrically to a current source particularly easily in this way.

As regards the materials, in accordance with a further embodiment of the current sensor apparatus according to the invention it has proven to be advantageous to form the sheet-metal element with a material containing an alloy having the constituents copper, iron and phosphorus, in particular with a composition of CuFeP. By means of these materials, both an optimum current flow and an optimum mechanical strength for fastening the current sensor apparatus in the vehicle could be achieved.

Advantageously, the current sensor apparatus according to the invention in accordance with a further embodiment has a measuring unit, which is arranged in the measuring section, wherein the measuring unit is coupled electrically to the resistor element in order to measure the voltage drop between two voltage measurement points in the measuring section.

Preferably, the current sensor apparatus according to the invention in accordance with an advantageous embodiment envisages a connection device which has connection pins or wireless transmission elements for transmitting measurement data.

Furthermore, one embodiment of the current sensor apparatus according to the invention in which the current sensor apparatus is produced by means of a stamping and bending method or a stamping and deep-drawing method has proven to be advantageous. By means of this method, particularly precise and at the same time easily controllable processing of the sheet-metal element is possible.

In addition, one embodiment of the current sensor apparatus according to the invention in which the sheet-metal element has a substantially L-shaped section is advantageous. The use of a sheet-shaped, L-shaped section has proven to be advantageous for utilizing the installation space for use in motor vehicles, in particular for batteries in motor vehicles.

For improved stability of the current sensor apparatus, an embodiment in which the clamping device is arranged on the short part of the L-shaped section has proven to be advantageous.

A further aspect of the invention relates to a motor vehicle comprising a current sensor apparatus according to one of the preceding embodiments.

BRIEF DESCRIPTION OF THE DRAWINGS

Further preferred embodiments are set forth in the dependent claims and the description below relating to an exemplary embodiment with reference to figures, in which:

DETAILED DESCRIPTION OF THE INVENTION

Figure 1:
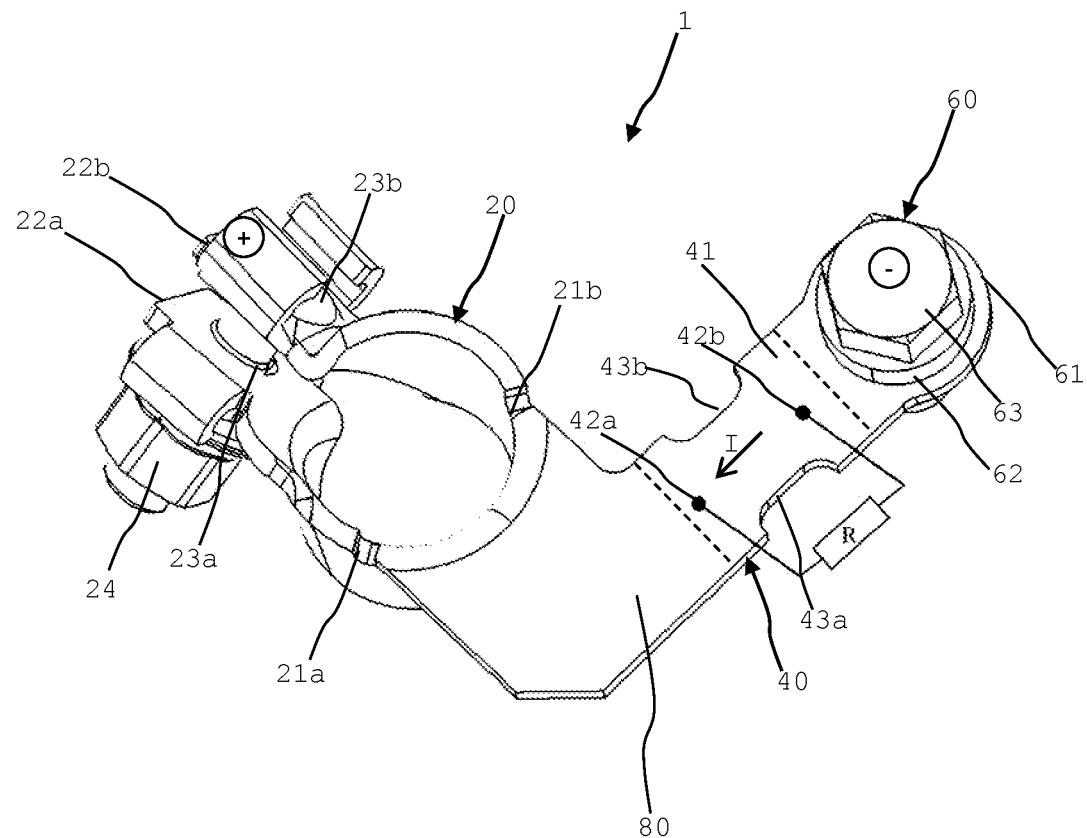
FIG. 1 shows a perspective view of a first exemplary embodiment of the current sensor apparatus according to the invention.

FIG. 1 shows a first exemplary embodiment of the current sensor apparatus 1 according to the invention for measuring a current. In this illustration, the current sensor apparatus 1 is shown from the lower side. The current sensor apparatus 1 has a clamping device 20 for attaching the current sensor apparatus 1 to a holding body. The clamping device 20 is in the form of a battery terminal and can be connected to a battery pole of an automobile battery. Furthermore, the current sensor apparatus 1 has an electrical resistor element 40, at which the current can be determined via a voltage or a voltage drop across two voltage measurement points 42a, 42b. The current sensor apparatus 1 can be coupled electrically to a zero potential or ground via an electrical grounding element 60. The clamping device 20, the resistor element 40 and the grounding element 60 are formed in one piece. Advantageously, the clamping device 20, the resistor element 40 and the grounding element 60 are formed from a one-piece sheet-metal element 80.

It is also conceivable to manufacture the resistor element 40 from a separate part and to connect said resistor element in each case to the clamping device 20 and the grounding element 60. In this case, cohesive connection forms such as welding, for example, are conceivable. The material of the resistor element 40 can be selected such that the electrical resistance of the resistor element 40 is largely independent of the temperature at the resistor element.

The sheet-metal element 80 is stamped out from a metal sheet and is re-formed by means of a stamping and bending method to give the form shown in FIG. 1. Alternatively, it is also conceivable for the sheet-metal element to be re-formed by means of a stamping and deep-drawing method in order to achieve the desired form. In this exemplary embodiment, a copper alloy with the composition CuFeP is used as starting material. The abovementioned alloy has a balanced ratio between a suitable electrical conductivity and the strength of the material and is particularly well suited for the intended use. However, other alloys with the constituents copper, iron and phosphorus and other current-conducting metals are also conceivable.

The clamping device 20 has an elongate form in the original unbent state of the sheet-metal element 80 and is bent in the form of a circle to form a clamping device 20, so that it can be connected to a battery connection of a motor vehicle. The clamping device 20 is oriented perpendicular to the main surface of an L-shaped section of the current sensor apparatus 1. The clamping device 20 has bending cutouts 21a, 21b in the transition region to the L-shaped section in order to facilitate perpendicular bending of the clamping device 20 to form the L-shaped section. In addition, the clamping device 20 has two free ends 22a, 22b, which each have a bore 23a, 23b. A fastening means 24, in this case in the form of a screw with a nut, is passed through the bore 23a, 23b in order to fasten the current sensor apparatus on a holding body, in this case the battery connection. The free ends 22a, 22b are bent in such a way that they are oriented slightly at an angle with respect to the main surface of the L-shaped section.

The substantially L-shaped section with the resistor element 40 and the grounding element 60 directly adjoins the clamping device 20, wherein the clamping device 20 adjoins the short part of the L-shaped section.

The resistor element 40 is formed in the form of a measuring section 41 integrated in the sheet-metal element, which are indicated by the dashed lines schematically in the figures. The measuring section 41 can be understood to mean a region which is shaped so as to be matched specifically to the electrical resistance and is delimited approximately by two voltage measurement points 42a, 42b. In order to increase the electrical resistance within the measuring section 41, recesses 43a, 43b are provided.

Figure 2:
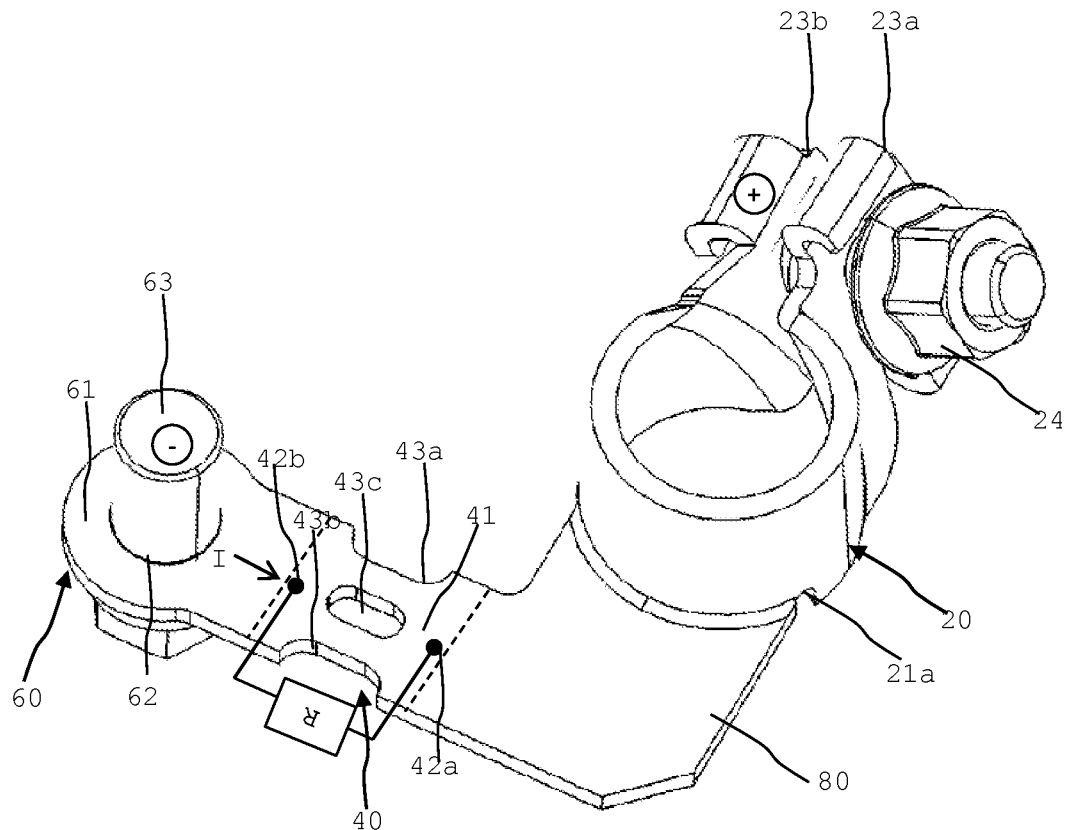
FIG. 2 shows a perspective view of a second exemplary embodiment of the current sensor apparatus according to the invention.

In the exemplary embodiment shown in FIG. 1, the hollow-shaped recesses 43a, 43b are provided on the edge regions of the sheet-metal element 80. As an alternative to this, it is also conceivable for a recess 43c to also be provided within the material in addition to the hollow-shaped recesses 43a, 43b, as is shown in the second exemplary embodiment shown in FIG. 2. The recesses 43a, 43b, 43c are arranged symmetrically with respect to the longitudinal axis of the measuring section 41 and advantageously have rounded-off edges. The voltage measurement points 42a, 42b are outside the region lying transversely to the direction of current flow I in which the recesses 43a, 43b, 43c are located. In the case of a current flow through the sheet-metal element 80, the current can then be determined via the voltage which is measured at the voltage measurement points 42a, 42b and the known electrical resistance R of the measuring section 41.

Figure 3:
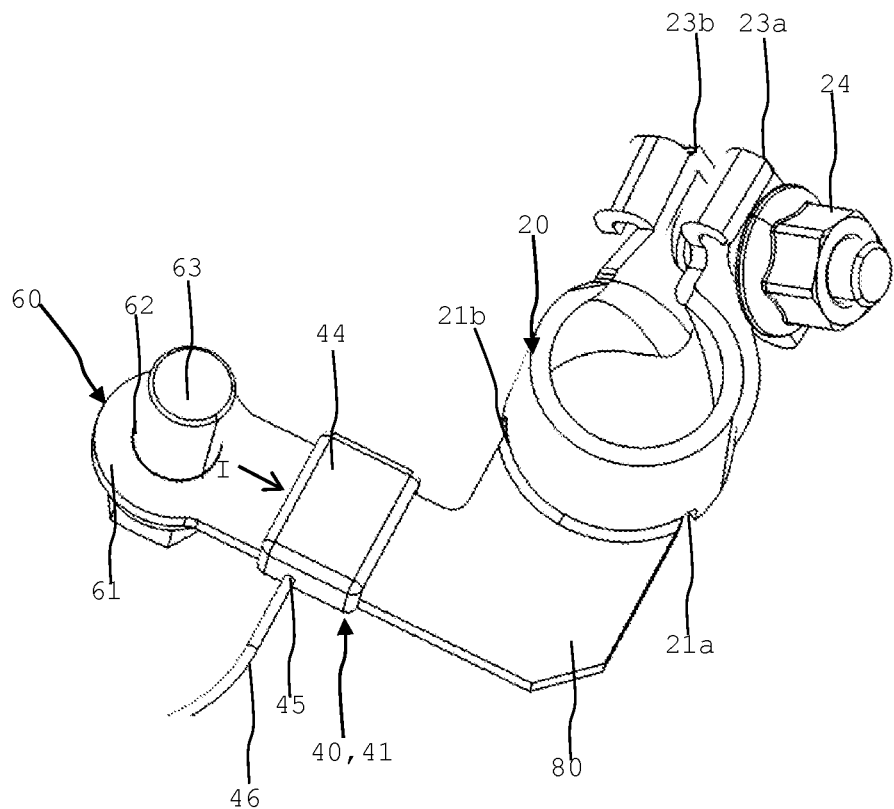
FIG. 3 shows a perspective view of a third exemplary embodiment of the current sensor apparatus according to the invention.
Figure 4:
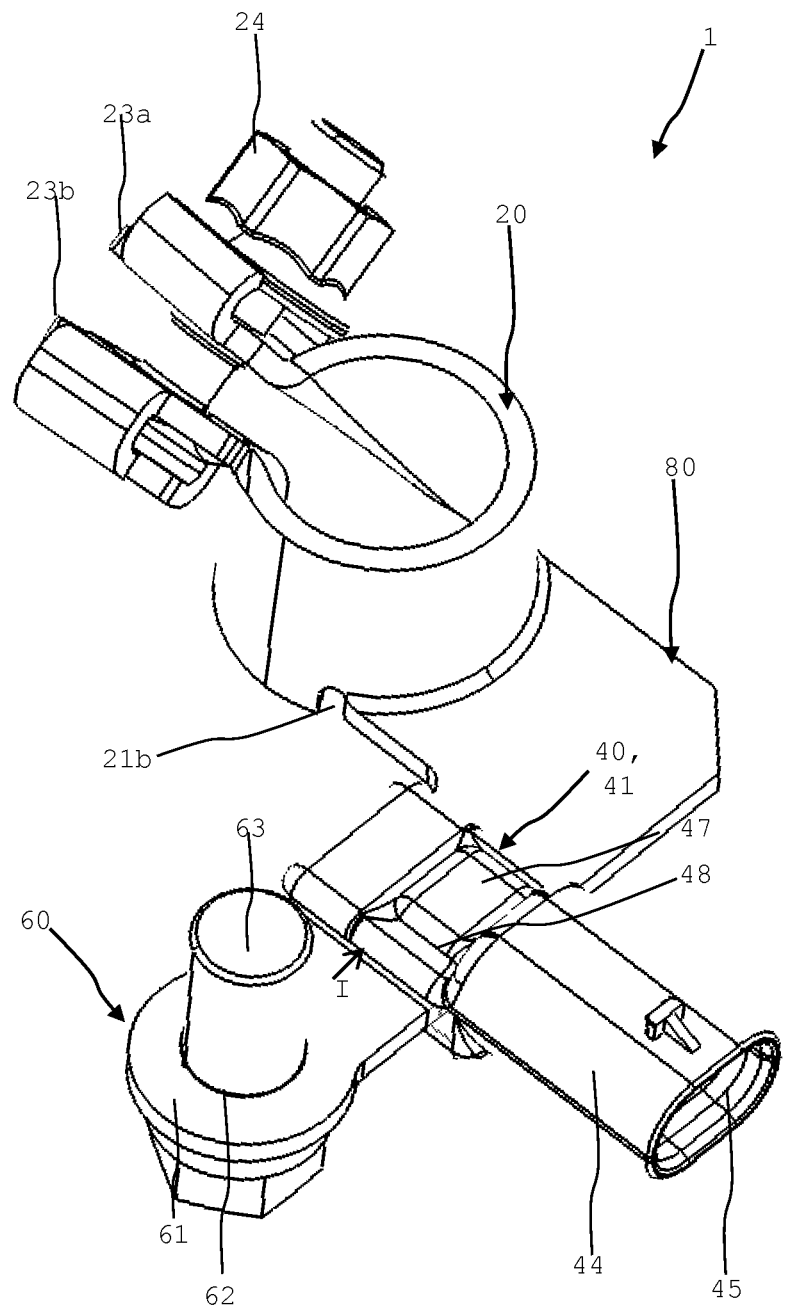
FIG. 4 shows a perspective view of a fourth exemplary embodiment of the current sensor apparatus according to the invention.

As shown in the third and fourth exemplary embodiments shown in FIGS. 3 and 4, the measuring section 41 is covered in watertight fashion by means of a housing 44, wherein the housing does not need to be watertight. The housing 44 surrounds the entire cross section of the sheet-metal element 80 in the region of the measuring section 41. It has a watertight opening 45, through which a cable 46 can be passed in order to transmit the measured data.

In addition, as shown in FIG. 4, it is conceivable to extend the current sensor apparatus through a measuring unit 47. The measuring unit is arranged in the measuring section 41, wherein the measuring unit is electrically coupled to the resistor element 40. The measuring unit 47 has, inter alia, a temperature sensor and is coupled thermally to the resistor element 40 in the region of the measuring section 41.

In addition, the measuring unit 47 is connected electrically to the resistor element 40 for measuring a voltage drop between two voltage measurement points 42a, 42b. Furthermore, connection devices 48, via which the measurement data can be transmitted, are attached to the measuring unit 47 or the resistor element 40. In the exemplary embodiment shown in FIG. 4, the connection devices 4$ are in the form of connection pins 48 and are attached to the measuring unit 47. Then, the current sensor apparatus can be connected to an evaluation unit by means of a male connector (not shown here) via the closable opening 45, which can optionally be watertight. However, it would also be conceivable to attach transmission elements for wireless transmission of measurement data to the measuring unit 47. Both the measuring unit 47 and the connection devices are arranged within the housing 44 for improved protection against external influences.

The grounding element 60 is arranged at the free end of the L-shaped section. In the exemplary embodiments, the free end 61 of the L-shaped section has a bore 62, through which a bolt 63 or a screw can be passed.

The current sensor apparatus 1 is connected into an electrical current path by virtue of the clamping device 20 being connected to a connection of a battery and the grounding element 60 being connected to a consumer, with the result that a current can flow through the sheet-metal element 80. Alternatively, provision is made for the clamping device to be connected electrically to the connection of a battery and for the grounding element to be connected electrically to ground. A voltage or voltage drop prevailing across the measuring section 41 is measured at the voltage measurement points 42a, 42b in the region of the measuring section 41, and then the current can be determined via said voltage or voltage drop.

The direct connection of the current sensor apparatus to the connection of the battery has the advantage that the temperature at the resistor element 40 is approximately the temperature at the connection of the battery. In this way, the temperature of the battery can be determined in order to determine the state of the battery. Furthermore, the temperature at the resistor element 40 can be measured by means of the temperature sensor. In this way, the influence of temperature on the electrical resistance of the resistor element 40 can be determined more precisely in order to eliminate this influence from the current measurement.

The invention has the particular advantage that it can be produced at particularly low cost and with a low level of complexity in terms of production owing to the one-piece design. The form of the current sensor apparatus 1 in accordance with the exemplary embodiments is particularly well suited for use in a motor vehicle for measuring the current output by a battery. The use of the current sensor apparatus is not restricted to this, however.

The invention claimed is:

1. A current sensor apparatus for measuring a battery current in motor vehicles, comprising:
    a clamping device for attaching the current sensor apparatus to a holding body,
    an electrical resistor element at which the current is measured through the electrical resistor element via a voltage, the electrical resistor element provided in the form of a measuring section having opposed edges defining a first width of the measuring section, each edge including a recess such that at least a portion of the measuring section has a second width narrower than the first width, the measuring section further including a hole in the portion of the measuring section having the second width, a housing covering the measuring section, the housing including an opening configured to receive a cable, wherein the housing is not completely watertight, but the housing is configured to be made watertight when the cable is received in the opening; and an electrical grounding element, via which the current sensor apparatus can be coupled electrically to a defined electrical potential, in particular zero potential, wherein the clamping device, the resistor element, and the grounding element are entirely formed in one piece from a single piece of metal.

2. The current sensor apparatus as claimed in claim 1, wherein the single piece of metal is a sheet-metal element.

3. The current sensor apparatus as claimed in claim 2, wherein the measuring section is integrated in the sheet-metal element.

4. The current sensor apparatus as claimed in claim 1, wherein the recesses are trough-shaped.

5. The current sensor apparatus as claimed in claim 1, further comprising a measuring unit, wherein the measuring unit has a temperature sensor.

6. The current sensor apparatus as claimed in claim 1, wherein the clamping device is in the form of a battery terminal.

7. The current sensor apparatus as claimed in claim 2, wherein the sheet-metal element contains an alloy with the constituents copper, iron and phosphorus, in particular with a composition of CuFeP.

8. The current sensor apparatus as claimed in claim 5, wherein the measuring unit is arranged in the measuring section, wherein the measuring unit is coupled electrically to the resistor element.

9. The current sensor apparatus as claimed in claim 8, wherein a connection device is provided which has connection pins or wireless transmission elements for transmitting measurement data.

10. The current sensor apparatus as claimed in claim 2, wherein the sheet-metal element has a substantially L-shaped section.

11. The current sensor apparatus as claimed in claim 10, wherein the clamping device is arranged on the short part of the L-shaped section.

12. A motor vehicle comprising a current sensor apparatus as claimed in claim 1.

13. The current sensor apparatus as claimed in claim 2, wherein the resistor element is designed to be in the form of a measuring section integrated in the sheet-metal element.

14. The current sensor apparatus as claimed in claim 1, wherein the clamping device, the resistor element and the grounding element are formed by a stamping and bending method or a stamping and deep-drawing method.

* * * * *